United States Patent [19]
Rafferty

[11] Patent Number: 6,146,913
[45] Date of Patent: Nov. 14, 2000

[54] METHOD FOR MAKING ENHANCED PERFORMANCE FIELD EFFECT DEVICES

[75] Inventor: Conor Stefan Rafferty, Summit, N.J.

[73] Assignee: Lucent Technologies Inc., Murray Hill, N.J.

[21] Appl. No.: 09/385,258

[22] Filed: Aug. 30, 1999

Related U.S. Application Data

[60] Provisional application No. 60/098,431, Aug. 31, 1998.

[51] Int. Cl.⁷ .................................................... G01R 31/26
[52] U.S. Cl. ........................... 438/16; 438/216; 438/303; 438/672; 438/696; 257/310; 257/355; 257/410; 257/411
[58] Field of Search ................................... 257/355, 411, 257/310; 438/672, 696, 303

[56] References Cited

U.S. PATENT DOCUMENTS

| | | | |
|---|---|---|---|
| 3,728,591 | 4/1973 | Sunshine | 257/355 |
| 4,044,452 | 8/1977 | Abbas et al. | 29/571 |
| 4,528,066 | 7/1985 | Merkling | 438/696 |
| 4,528,211 | 7/1985 | Bhagat | 438/672 |
| 4,575,921 | 3/1986 | Bhagat | 438/303 |
| 5,861,651 | 1/1999 | Brasen et al. | 257/411 |
| 5,961,651 | 1/1999 | Brasen et al. | 257/411 |

*Primary Examiner*—David Nelms
*Assistant Examiner*—Phuc T. Dang
*Attorney, Agent, or Firm*—Mathews, Collins, Shepherd & Gould, P.A.

[57] ABSTRACT

This invention is predicated on applicant's discovery that near the gate dielectric/semiconductor interface, surface roughness of a particular spectral range plays a disproportionately larger role in scattering electrons and impeding their transport. Moving electrons will not enter the nooks and crannies of roughness having wavelength shorter than about 100 Å and therefore are not affected by them, and electrons are less affected by roughness having wavelengths longer than about 1000 Å. Accordingly, it is desirable to reduce the surface roughness of gate dielectrics at the interface. This can be accomplished prior to dielectric formation by inspection of semiconductor wafers for surface roughness and rejection of those wafers with high surface roughness content in the range 100 Å to 1000 Å. Such inspection also provides a valuable criterion for selecting optimum semiconductor processing steps.

13 Claims, 7 Drawing Sheets

$$-\nabla \cdot (\epsilon \nabla \psi) = q(p - n + N_D^+ - N_A^-)$$

$$\nabla \cdot (n\mu_n \nabla \phi_n) = g - r$$

$$\nabla \cdot (-p\mu_p \nabla \phi_p) = g - r$$

$$\phi_n - \psi + \frac{kT}{q} \ln \frac{n}{n_i} = 2b_n \left( \frac{\nabla^2 \sqrt{n}}{\sqrt{n}} \right)$$

$$\phi_p - \psi - \frac{kT}{q} \ln \frac{p}{n_i} = -2b_p \left( \frac{\nabla \sqrt{p}}{\sqrt{p}} \right)$$

METHOD FOR MAKING ENHANCED PERFORMANCE FIELD EFFECT DEVICES

CROSS REFERENCE TO RELATED APPLICATIONS

This application claims the benefit of U.S. Provisional Application Serial No. 60/098,431 filed Aug. 31, 1998, the entire contents of which, including all attachments is hereby incorporated by reference.

FIELD OF THE INVENTION

This invention relates to a method for making enhanced performance field effect devices and, in particular, to a method for enhancing the performance of field effect devices by reducing the surface roughness of gate dielectrics in a particular spectral range.

BACKGROUND OF THE INVENTION

Field effect devices, such as field effect transistors, are fundamental components in modern electronics. They are basic components in most digital and many analog circuits, including circuits for data processing and telecommunications. Indeed it has been surmised that field effect transistors are among the most numerous of human-made objects.

Field effect devices typically comprise a controllable-conductivity path, called a channel, disposed between a source and a drain. A gate electrode is formed on a thin dielectric film overlying the channel (the gate dielectric). For example, the source and the drain can be n-type regions of silicon and the channel can be a p-type region connecting them. The gate electrode can be a conductively-doped polysilicon layer, and the gate dielectric is typically silicon oxide.

In a normally off transistor, if no voltage is applied to the gate, current cannot flow from the source to the channel or from the channel to the drain. However if a sufficient positive voltage is applied to the gate, electrons are induced into the channel region, thereby creating a continuous n-type conductive path between the source and the drain.

As these devices are made with smaller dimensions, quantum mechanical effects become an increasingly important limitation on device performance. For example, when the device is turned on, electrons from the source accelerate through the channel. They can interact with the gate dielectric, particularly near the semiconductor/dielectric interface, and such interactions can affect the performance of the device. Accordingly, there is a need for a method for making field effect devices which takes quantum mechanical effects into account.

SUMMARY OF THE INVENTION

This invention is predicated on applicant's discovery that near the gate dielectric/semiconductor interface, surface roughness of a particular spectral range plays a disproportionately larger role in scattering electrons and impeding their transport. Moving electrons will not enter the nooks and crannies of roughness having wavelength shorter than about 100 Å and therefore are not affected by them, and electrons are less affected by roughness having wavelengths longer than about 1000 Å. Accordingly, it is desirable to reduce the surface roughness of gate dielectrics at the interface. This can be accomplished prior to dielectric formation by inspection of semiconductor wafers for surface roughness and rejection of those wafers with high surface roughness content in the range 100 Å to 1000 Å. Such inspection also provides a valuable criterion for selecting optimum semiconductor processing steps.

BRIEF DESCRIPTION OF THE DRAWINGS

The nature, advantages and various additional features of the invention will appear more fully upon consideration of the illustrative embodiments now to be described in detail in connection with the accompany drawings. In the drawings.

It is to be understood that these drawings are for purposes of illustrating the concepts of the invention and, except for the graphs, are not to scale.

DETAILED DESCRIPTION

Figure 1:
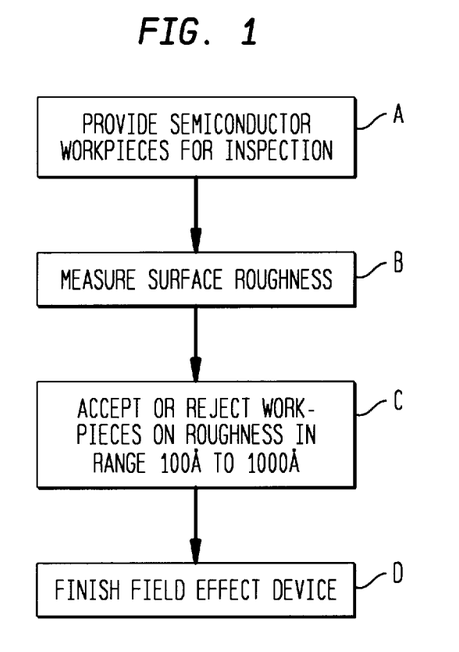
FIG. 1 is a flow diagram showing the steps of the preferred method for making an enhanced performance field effect device.

Referring to the drawings, FIG. 1 illustrates the steps in making a field effect device having enhanced performance. As shown in block A of FIG. 1, the first step is to provide a semiconductor workpiece. The workpiece is typically a monocrystalline silicon wafer.

The next step shown in block B of FIG. 1 is to inspect the workpiece for surface roughness having wavelengths in a range from about 100 angstroms to about 1000 angstroms. Roughness wavelengths in this range can be determined by any of a variety of techniques including atomic force microscopy (AFM), scanning tunneling microscopy and glancing x-ray reflectometry.

Figure 2:
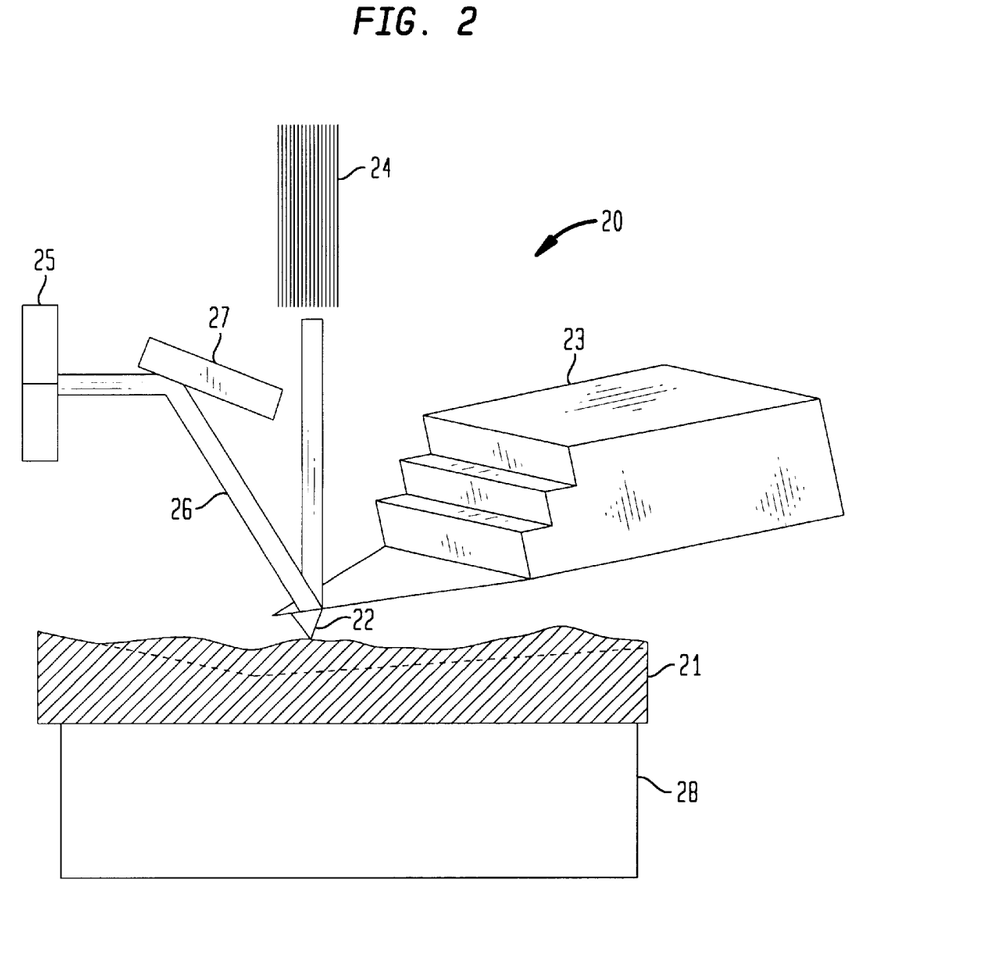
FIG. 2 is a schematic diagram of apparatus useful for surface roughness inspection.

FIG. 2 schematically illustrates apparatus 20 for determining surface roughness of a workpiece 21 using AFM. In essence, the AFM apparatus comprises a probe 22 cantilever mounted on a substrate 23. A laser 24 directs light onto the probe tip, and a photodector 25 receives light 26 reflected from the tip of the probe, as by way of mirror 27. The workpiece 21 is mounted on a three-dimensional piezoelectric scanner 28 such as a piezo-tube.

In operation, the probe is scanned across the surfaces of the workpiece with a constant, low force. Typically the probe is mounted on the end of a cantilever that has a low spring constant (about 1 Newton/m). When the probe tip is brought in contact with the workpiece surface, the cantilever deflects upward, and this movement is sensed by the photodetector. To maintain a constant force between the probe tip and the sample, a feedback circuit (not shown) responsive to the photodector signal moves the piezo-tube to raise or lower the sample. Further details concerning AFM are set forth in R. Wiesendanger, *Scanning Probe Microscopy and Spectroscopy* (Cambridge U. 1995), which is incorporated herein by reference.

Figure 3:
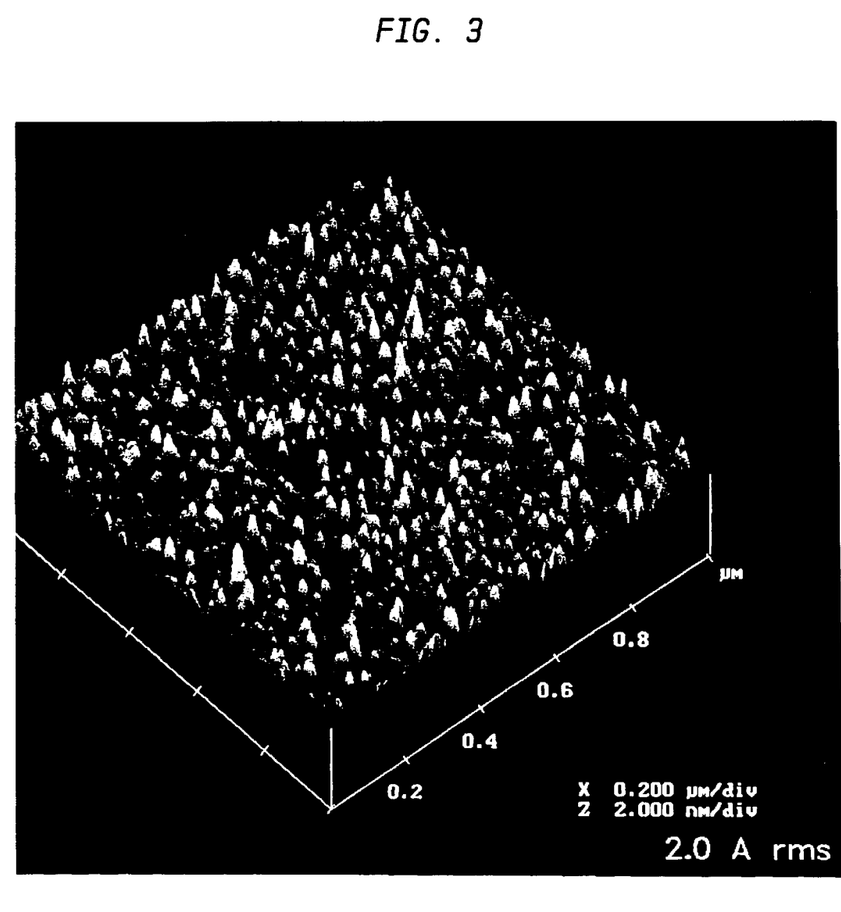
FIG. 3 is a topographical image of the surface of a typical silicon workpiece.

The result of AFM is a measurement of the vertical deflection z of the cantilever as a function of the position $\bar{x}$ of the scanner. This date is typically used to provide a topographic image of the surface. FIG. 3 illustrates a typical such image of a silicon workpiece.

The wavelength spectrum of the surface roughness can be determined by Fourier analysis of this data. In essence, using Fourier transforms, one determines the amplitudes of a sequence of sinusoidal components that would replicate the topographic surface. Thus, for example, if the surface roughness is represented as a function of a spatial dimension $z(\overline{x})$, the surface roughness can be transformed into a roughness spectrum S(f) as a function of wavenumber $\overline{f}=1/$wavelength:

$$S(\overline{f}) = \frac{1}{A}\left|\int z(\overline{x})e^{-2\pi i \overline{f} \cdot \overline{x}}d a\right|^2,$$

where the integration is over the area A. This transformed spectrum is known as the power spectral density (PSD).

In accordance with the invention, workpieces are inspected for their surface roughness content in the range of wavelengths between 100 angstroms and 1000 angstroms, i.e. their bandwidth-limited PSD.

As shown in block C of FIG. 1, workpieces are accepted or rejected based upon their roughness content in the range 100 angstroms–1000 angstroms. Wafers having higher roughness content in this range are rejected. Lower content wafers are accepted. For example, wafers having higher than average surface roughness in the spectral range are typically rejected. A measure of the roughness in this bandwidth limited spectral region can be obtained by calculating the a using the integral:

$$\sigma = \sqrt{2\int_a^b (f_x) d f_x}$$

where a=1/100 angstroms and b=1/1000 angstroms. In general, the lower σ, which we shall call the deviation of surface roughness, the better. With present wafers, desired values of σ lie in the range σ<4 angstroms. Preferred values are σ<2 angstroms, and near perfect workpieces would have σ<1 angstrom.

In the final step (block D) accepted workpieces with a low deviation of roughness in the wavelength range 100 Å to 1000 Å are fabricated into field effect devices in the conventional manner. Typically a thick layer of passivating silicon oxide is formed on a silicon workpiece. An opening is made in the passivating oxide where a field effect transistor is to be made, and a thin gate dielectric (typically silicon oxide less than 80 angstroms thick) is formed over the region that is to become the gate, source and drain of the transistor. A gate electrode, typically polysilicon, is patterned onto the dielectric layer. The device is typically finished by providing a lightly doped drain implant, depositing $SiO_2$ with LPCVD TEOS and etching back to form gate spacers. The source/drain area is reopened, and the source and drain are doped, as by implantation. An additional dielectric is applied and metal contacts are made to the source and the drain. Additional details of the device fabrication process are described, for example, in S. J. Hillenius et al, "A Symmetric submicron CMOS Technology," *IEDM Tech. Digest*, 252 (1986) which is incorporated herein by reference.

Figure 4:
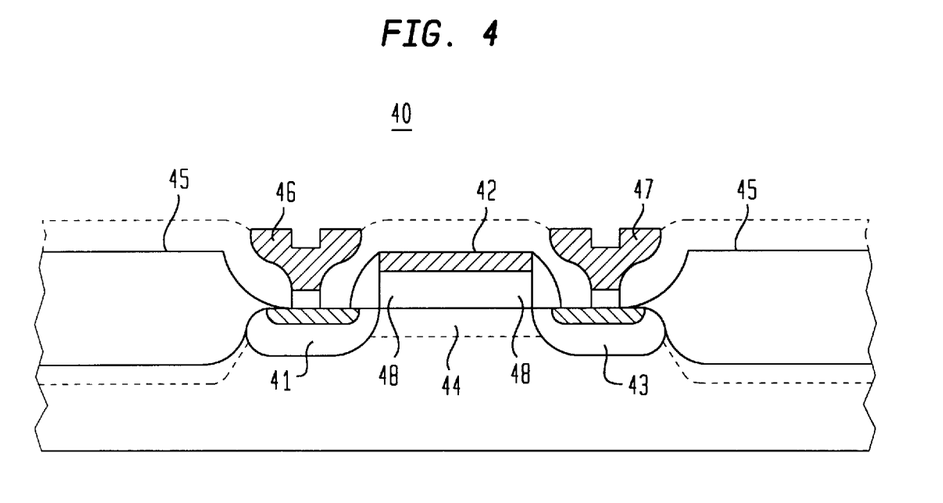
FIG. 4 is a schematic cross section of a finished device.

FIG. 4 is a schematic cross section of the resulting device 40. It is similar to a conventional silicon-gate MOS field effect transistor. It has the conventional source 41, gate 42, drain 43 and channel 44. It has a conventional passivating layer 45 and conventional ohmic contacts 46 and 47. It differs from conventional devices in that the gate dielectric 48 has low surface roughness content in the wavelength range 100 angstroms to 1000 angstroms. The result of this difference is enhanced performance in that the interference of the gate dielectric with the source/drain current is minimal.

While, not necessary for the invention, applicant's best current understanding of the reason for this enhanced performance is that the relatively long-wavelength electrons flowing through the channel cannot enter the nooks and crannies of short wavelength roughness, and therefore they cannot scatter electrons or impede their transport. The electrons do interact appreciably with roughness in the range 100 angstroms to 1000 angstroms so that minimization of roughness in this range reduces impedance to electron transport.

For those knowledgeable of quantum mechanical modeling, a theoretical rationale for this conclusion is based upon the use of a density gradient model to calculate quantum mechanical corrections to classical carrier transport in MOS inversion/accumulation layers.

In essence, the density gradient model is a more accurate approximation for introducing quantum mechanical corrections into macroscopic electron transport description. The quantum mechanical corrections are introduced by making the electron gas equation of state density gradient dependent, thus making the electron continuity equation a fourth order partial differential equation.

Figure 5:
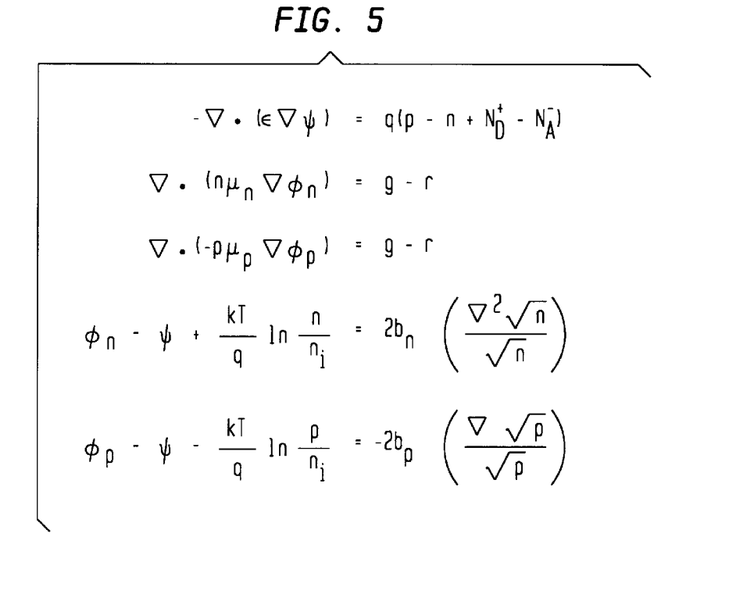
FIG. 5 shows equations useful in understanding the theory of the invention.

Introducing Dirichlet and Newmann boundary conditions for Ψ and $\phi_n$ on the ohmic and dielectric interfaces of the device, a final system of equations to be solved for device simulation with quantum mechanical corrections is set forth in FIG. 5, where Ψ, $\phi_n$, √n and √p, designating the conventional solid state parameters, are fundamental variables, g and r are generation and recombination rates, respectively, and only the steady state is considered. This model was applied to calculate the effects of surface roughness.

Figure 6:
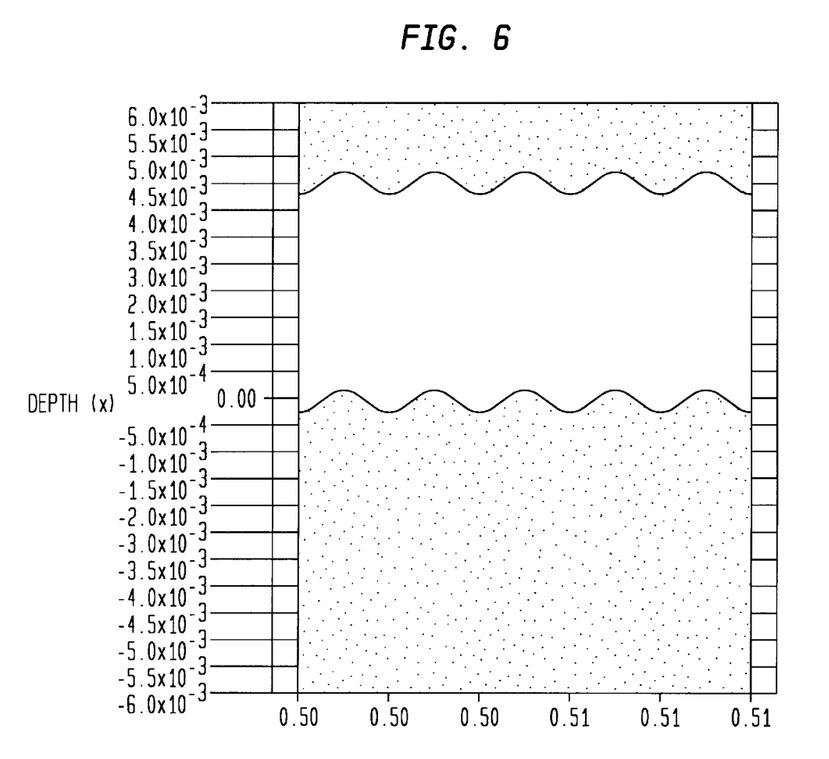
FIGS. 6, 7, 8 and 9 are graphical illustrations useful in understanding the theory.

Gate oxides are imperfect. A flat surface is only an idealization of the true interface. The density gradient model was used to explore the effects of surface roughness on the electron distribution below the gate oxide. A less ideal structure is shown in FIG. 6, where a 40 angstrom oxide is grown on a surface with 4 angstrom peak-to-peak roughness and a 20 angstrom wavelength. The thickness of the oxide is assumed for this calculation to be constant. The calculation was done on a single period of the structure using an unstructured triangular mesh to represent the curved shapes.

Figure 7:
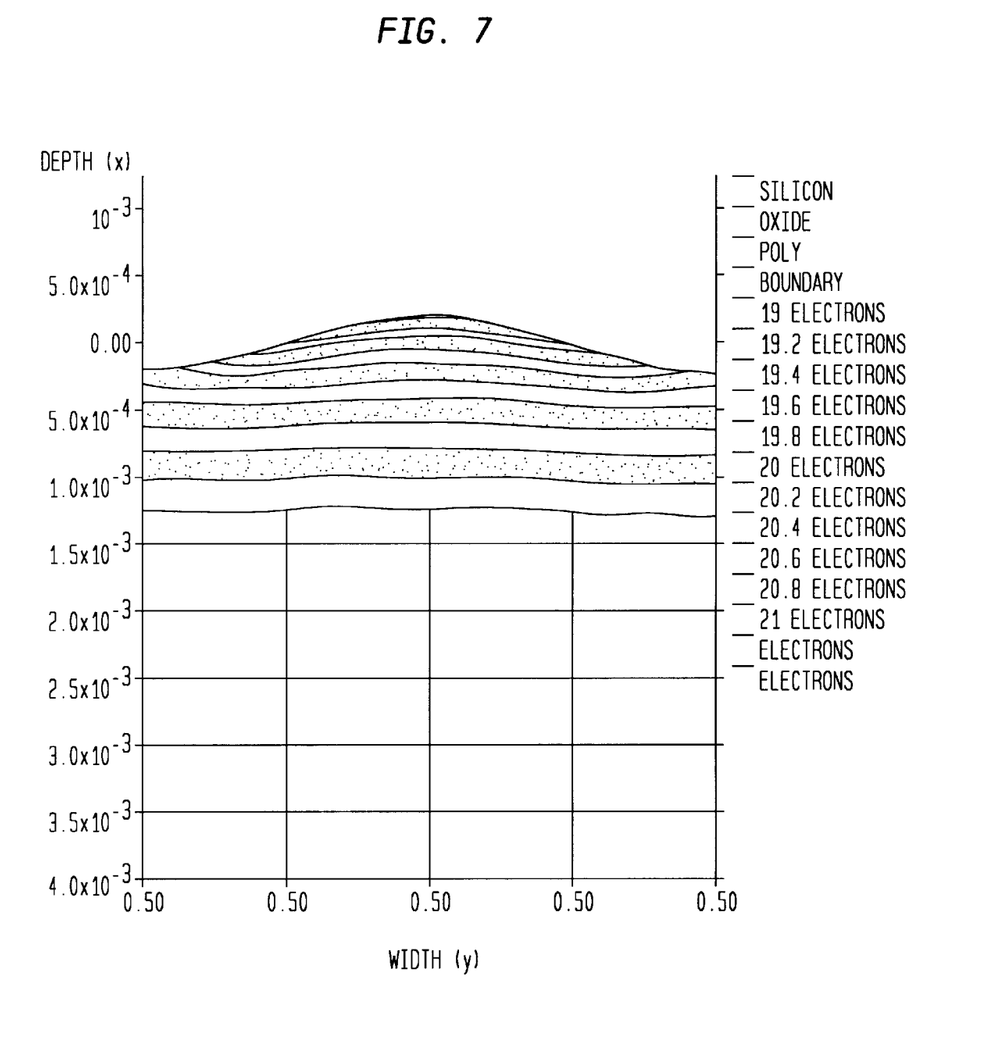
Figure 8:
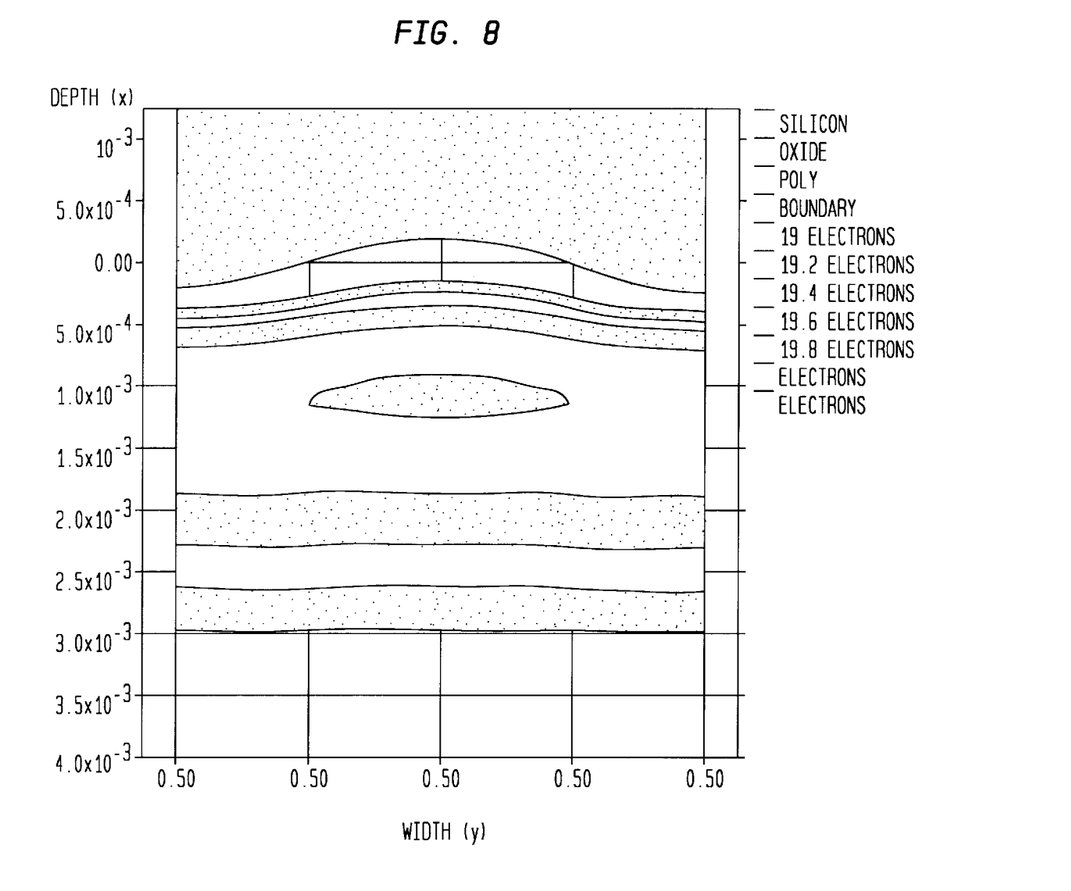
Figure 9:
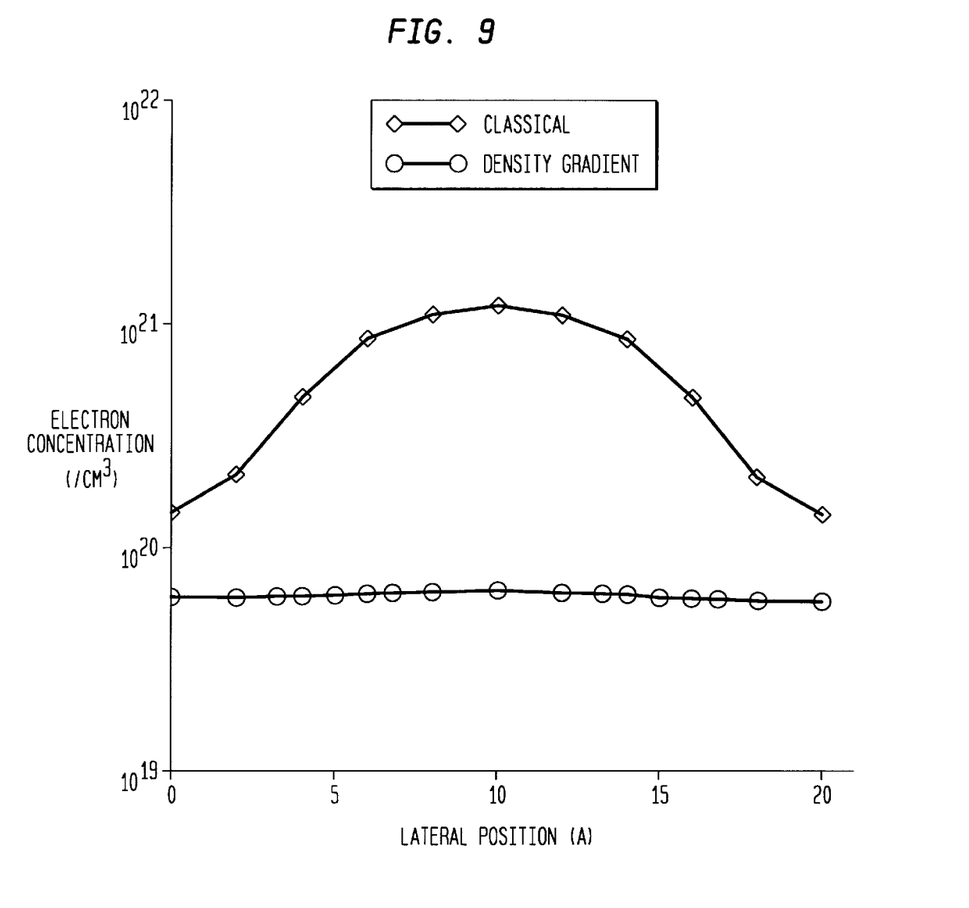

FIGS. 7 and 8 shows the electron density curves underneath the rough oxide for the classical model and the corrected model. The classical model (FIG. 7) shows large local enhancements in the electron concentration because its electrons are able to take advantage of the hollows to get electrons to a higher potential. The density gradient model (FIG. 8), whose electrons are unable to enter the small hollows, shows a smaller influence of the roughness. The final figure (FIG. 9) compares the peak electron concentrations for the two models, along the interface for classical electrons, and along a line about 10 angstroms below the interface for the quantum electrons. The results show that scattering from short wavelength roughness should be quite limited due to the exclusion of carriers from the surface. In contrast, scattering from roughness in the range 100 angstroms to 1000 angstroms is estimated to be appreciable. Further details concerning use of the density-gradient model are included in the attached paper by C. S. Rafferty et al. entitled "Multi-dimensional Quantum Effect Simulation..." which is incorporated herein by reference.

It is to be understood that the above-described embodiments are illustrative of only a few of the many possible specific embodiments which can represent applications of the principles of the invention. Numerous and varied other methods can be made by those skilled in the art without departing from the spirit and scope of the invention.

What is claimed:

1. In the method for making a field effect device on a semiconductor workpiece comprising the steps of providing a semiconductor workpiece, forming on a surface of said workpiece a gate electrode separated from said semiconductor by a gate dielectric, a channel region in said semiconductor underlying said gate, and source and drain regions in said semiconductor, the improvement wherein:

before said gate dielectric and gate electrode are formed on said surface, said semiconductor workpiece is provided by inspecting the surface of said workpiece for surface roughness in the wavelength range 100 angstroms to 1000 angstroms and rejecting or accepting the workpiece based on the roughness content in said range.

2. The method of claim 1 wherein said semiconductor workpiece is a silicon wafer.

3. The method of claim 1 wherein a plurality of workpieces are provided for making a plurality of field effect devices having an average roughness content, wherein workpieces having a roughness content higher than said average roughness content in said range are rejected.

4. The method of claim 1 wherein workpieces having a deviation in surface roughness in said range greater than 4 angstroms are rejected.

5. The method of claim 1 wherein workpieces having a deviation in surface roughness in said range greater than 2 angstroms are rejected.

6. The method of claim 1 wherein workpieces having a deviation in surface roughness in said range greater than 1 angstrom are rejected.

7. A method for evaluating a semiconductor workpiece for use in making a field effect transistor comprising:

providing a semiconductor workpiece having a surface for the forming of components thereon;

measuring the roughness of the surface; and accepting or rejecting the workpiece based on the roughness of the surface based on the roughness range of 100 to 1,000 angstroms.

8. The method of claim 7, further comprising the step of fabricating the workpiece into the field effect device after the workpiece is accepted or rejected based on the roughness of the surface.

9. The method of claim 7, wherein the step of rejecting or accepting comprises accepting the workpiece wherein the workpiece has a roughness less than 100 angstroms.

10. The method of claim 7, wherein the step of rejecting or accepting comprises rejecting the workpiece wherein the workpiece has a roughness greater than 1,000 angstroms.

11. The method of claim 7, wherein the step of measuring comprises application of atomic force or scanning tunneling microscopy to the workpiece surface.

12. The method of claim 7 wherein the step of measuring comprises application of x-ray reflectometry to the workpiece surface.

13. A field effect transistor having reduced interference of the gate dielectric with the source or drain current, wherein the field effect transistor is fabricated according to the method of claim 8.

* * * * *